(12) United States Patent
Viti

(10) Patent No.: US 6,798,207 B2
(45) Date of Patent: Sep. 28, 2004

(54) CIRCUIT FOR ACTIVE DECOUPLING OF TRANSMIT COILS IN NUCLEAR MAGNETIC RESONANCE IMAGING APPARATUSES, PARTICULARLY OF THE LOW FIELD TYPE

(75) Inventor: Vittorio Viti, Arezano (IT)

(73) Assignee: Esaote, S.p.A., Monferrato (IT)

( * ) Notice: Subject to any disclaimer, the term of this patent is extended or adjusted under 35 U.S.C. 154(b) by 0 days.

(21) Appl. No.: 10/283,151

(22) Filed: Oct. 30, 2002

(65) Prior Publication Data

US 2003/0080801 A1 May 1, 2003

(30) Foreign Application Priority Data

Oct. 31, 2001 (IT) .................................. SV2001A000039

(51) Int. Cl.⁷ ................................................ G01V 3/00
(52) U.S. Cl. ...................................... 324/322; 324/318
(58) Field of Search ............................... 324/322, 318, 324/314, 300, 306, 307, 309

(56) References Cited

U.S. PATENT DOCUMENTS 4,739,271 A * 4/1988 Haase ........................ 324/322
4,763,076 A   8/1988 Arakawa et al.
4,810,968 A * 3/1989 Van Heelsbergen ......... 324/322
4,881,034 A * 11/1989 Kaufman et al. ........... 324/318
5,144,244 A   9/1992 Kess
5,621,323 A   4/1997 Larsen

FOREIGN PATENT DOCUMENTS

| EP | 0 113 413 A2 | 7/1984 |
|----|--------------|--------|
| EP | 0 306 763 A2 | 3/1989 |
| JP | 08-008604    | 1/1996 |

* cited by examiner

Primary Examiner—Louis Arana
(74) Attorney, Agent, or Firm—Burns, Doane, Swecker & Mathis, L.L.P.

(57) ABSTRACT

A circuit for active decoupling of transmit coils in Nuclear Magnetic Resonance imaging apparatuses, particularly of the low field type, includes at least one PIN diode (D1), which is connected in series with the conductors of at least one transmit coil (1) and has at least one input (4) for an incoming bias current. The circuit has at least one additional diode (D2) which is a silicon diode connected in antiparallel with the PIN diode (D1).

18 Claims, 4 Drawing Sheets

CIRCUIT FOR ACTIVE DECOUPLING OF TRANSMIT COILS IN NUCLEAR MAGNETIC RESONANCE IMAGING APPARATUSES, PARTICULARLY OF THE LOW FIELD TYPE

CROSS-REFERENCE TO RELATED APPLICATIONS

The present application claims priority of Italian patent application No. IT SV2001A000039, filed on Oct. 31, 2001. The entire contents of which are incorporated herein by reference.

BACKGROUND OF THE APPLICATION

The invention relates to a circuit for active decoupling of transmit coils from receiving coils in Nuclear Magnetic Resonance imaging apparatuses, particularly of the low field type.

Systems of this type are currently known, which allow active decoupling, i.e., based on the feeding of a transmit coil control signal. The control signal consists of an adequate bias current which is provided to a PIN diode to switch the latter to the conductive state during transmission, or which is suppressed to switch the PIN diode to the nonconductive state, hence to generate the transmit coil cutoff condition in which said transmit coils are decoupled from the receiving coils during reception of echo signals, with respect to mutual induction interference caused by induction.

Transmit coils are decoupled to prevent the latter from generating noise in the reception of echo signals by the receiving coils, due to mutual induction interference between said transmitting and receiving coils.

The cutoff of transmit coils prevents any current from being induced in the transmit coils during reception, which current might generate an influence on the receiving coils.

Two types of decoupling circuits are basically available at present, i.e. passive and active decoupling circuits.

In passive decoupling circuits, the conductors of transmit coils have at least two silicon diodes, for automatic cutoff, i.e., decoupling of the transmit coils from the receiving coils when no RF coil exciting signal is present. This type of decoupling circuit has certain drawbacks. First, since the excitation pulses consist of oscillating currents, when the level of these pulses falls below a certain threshold, the diode is switched to an open-circuit condition, in which the transmit coil is cutoff and decoupled. The conductive state is restored when the signal level rises again above the diode conduction threshold. This behavior introduces distortions in transmit coil exciting pulses, which affect image quality, due to abnormal excitation of transmit coils and the consequent deformations in the RF signal generated by the coils. Therefore, the quality with which image slices are selected is also affected. This condition is generally further worsened by the fact that transmit coils are composed of several sections connected in series, one diode or one pair of diodes being associated in series with each of said sections. Each of these diodes clips the excitation pulse based on the value of its own conduction threshold.

The above clearly shows that, theoretically, the passive decoupling circuit has a threshold-based operation, while the decoupling of transmit coils requires a decoupling circuit that has a time-based operation, i.e., that is switched to the conductive state, in which transmit coils are not cut off, at the start of excitation pulse transmission on the feedline, and to the decoupling state, in which transmit coils are cut off, at the end of excitation pulse transmission, without introducing any signal deformation. Therefore, passive decoupling circuits provide approximations of the functions required from the decoupling circuit, which are based on the strengthening of silicon diode features.

Active decoupling circuits also use diodes, particularly PIN diodes, i.e., diodes whose conduction features may be controlled by an adequate bias current.

Although these PIN diodes are theoretically fit for the required functions, the conductive state being entered by feeding an adequate bias current, they still have a drawback. Since the coil exciting pulses consist of oscillating currents, in the negative half-period of said pulses, the diode bias charge, due to the bias current applied thereto, is reduced, and this may cause the bias condition to drop below the level required to keep the PIN diode in the conductive state. This drawback is associated with the period of the transmit coil exciting pulse. Referring to Nuclear Magnetic Resonance imaging apparatuses, which include devices for decoupling transmit coils from receiving coils, two categories shall be assumed to exist: high field apparatuses and low field apparatuses.

In high field apparatuses, the negative half-periods of excitation pulses have a short duration, hence the drawback of active decoupling circuits, operating with said PIN diodes, is removed or has a lower effect.

However, in low field apparatuses, the negative half-periods of transmit coil exciting pulses must be longer, hence PIN diode behavior becomes an important problem. In fact, in order that the PIN diode may be held in the conductive state for the long negative half-periods of transmit coil exciting pulses, very high bias currents should be applied, higher than those allowed for PIN diodes. When the duration of the negative half-period is such that the bias current applied is not sufficient to maintain the conductive state, the PIN diode gradually passes to the open-circuit condition. As the bias charge decreases, the internal resistance increases, and at high intensities of the transmit coil exciting current during the negative periods has a high intensity, the Joule value generated in the diode rises, and may reach such values as to cause the diode to be destroyed and/or the brazing tin seam on the track of the printed circuit to melt.

U.S. Pat. No. 5,621,323 discloses a decoupling circuit for receiving coils which includes two diodes, more precisely a fast and low-power PIN diode, and a conventional slow and high-power diode, connected in antiparallel in the circuit of the receiving coils. As used herein, "antiparallel" means in parallel, but with reversed polarities.

The decoupling circuit so formed is a passive decoupling circuit, which means that no currents for controlling the bias condition of the PIN diode are provided, and this circuit is proposed to avoid the use of active decoupling circuits. The patent expressly recommends not to use active decoupling circuits for receiving coils. Furthermore, from a functional point of view, the arrangement proposed in the patent, which does not relate to transmit coils, but only to receiving coils, in which induced currents are considerably smaller than in transmit coils, is based on a problem that is totally different from the one that forms the subject of this invention and does not relate to the bias current increase required to maintain the PIN diode in the conductive state.

EP 1 130 413 discloses the decoupling of receiving coils for Nuclear Magnetic Resonance apparatus clearly of the high field type.

In first instance the decoupling circuit comprises two PIN diodes arranged in antiparallel but the operation of the decoupling circuit for the receiving coil operates in a opposite manner as the decoupling of a transmission coil.

Furthermore the decoupling circuit disclosed in EP 1 130 413 does not consider the problems caused by the intensity of the bias current and by the power which can be dissipated by the pin diode which may considerably increase the costs of the circuits. These problems are not dramatic in combination of receiving coils but are dramatic in the transmitting coils.

Transferring the decoupling circuit of EP 1 130 413 from the receiving coil to a transmitting coil of an high field MRI apparatus has no use since the known active decoupling circuits formed by simple PIN diodes not connected to an antiparallel further diode are able to maintain the conduction of the RF current of the excitation pulse, by feeding to the PIN diode a reasonable DC bias current.

The transfer of a decoupling circuit according to EP 1 130 413 to a low field MRI apparatus is not obvious because the solution of the problem consists only in increasing the bias current and the power that the PIN diode may dissipate up to the desired values taking into account the increases of costs related therewith. EP 1 130 413 suggests using the disclosed decoupling circuit (page 4, line 40) for low power conditions, which is exactly the contrary of the situation to which the present invention applies, namely low field and high power conditions, thus rendering the above mentioned transfer of the decoupling circuit according to 1 130 413 to this condition is not obvious.

OBJECTS AND SUMMARY

An object of the invention is to provide a circuit for active decoupling of transmit coils from receiving coils of a low field magnetic resonance apparatus by cutting said transmit coils off, while allowing to limit the bias current and to maintain the conductive state of the decoupling circuit even for long negative half-periods of excitation pulses, and obviating the drawbacks of the above mentioned prior art circuits.

The invention solves the above problem by providing a decoupling circuit like the one described hereinbefore, which uses at least an additional silicon diode connected in antiparallel to the PIN diode.

The decoupling circuit may include several PIN diodes connected in series to each other and/or to sections of the transmit coil conductor, each having an input for a bias current, which input is connected to a generator of said bias current, a silicon diode being provided for each of said PIN diodes and being connected thereto in antiparallel.

In accordance with the above description, the decoupling circuit of this invention has at least one pair of diodes connected in antiparallel with each other and in series with the conductor of the transmit coil, one of the two diodes being a PIN diode and the other a silicon diode, or two, three or more of said pairs of diodes being connected in series with each other and/or with the conductor of the excitation pulse transmitting coil.

Particularly, in combination with a transmit coil, including a certain number of turns, which are electrically separated from each other into several sections, connected in series with each other and with the excitation pulse feedline, there are provided, upstream from each coil section, one or more antiparallel pairs of PIN diodes and silicon diodes.

The silicon diode connected in antiparallel with the PIN diode allows to limit the bias current and to obviate the above drawbacks since, if the bias charge is reduced in the negative half-period of the excitation pulses, the PIN diode function will be substantially assumed by the silicon diode. In this condition, the intensity of the excitation pulse is rather high, certainly above the conduction threshold of the silicon diode and allows to obtain substantially distortion free excitation pulses.

BRIEF DESCRIPTION OF THE DRAWINGS

The characteristics of the invention and the advantages derived therefrom will appear more clearly from the following description of a few non limiting embodiments, illustrated in the annexed drawings, in which.

DETAILED DESCRIPTION OF PREFERRED EMBODIMENTS

Figure 1:
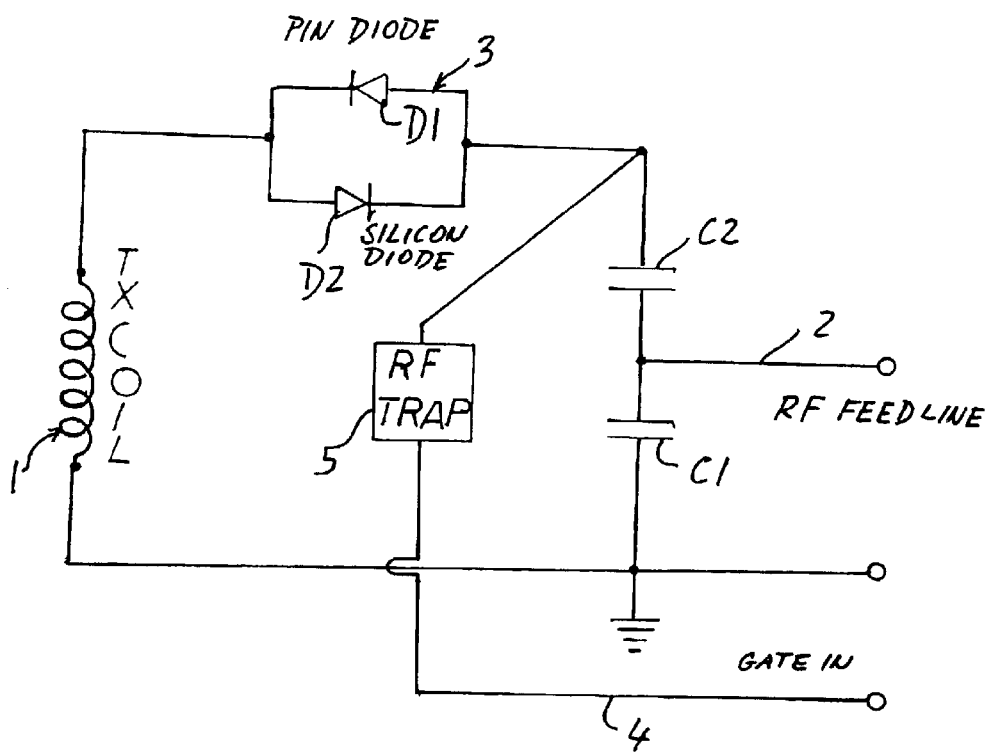
FIG. 1 schematically shows a first simplified embodiment of a combination of a decoupling circuit of the invention with a transmit coil.

Referring to FIG. 1, a transmit coil 1 of a Nuclear Magnetic Resonance imaging apparatus is connected by tuning capacitors C1, C2, to a line 2 for feeding an excitation pulse generated by the Nuclear Magnetic Resonance imaging apparatus in a well-known manner. An active decoupling circuit 3 is connected in series with said excitation pulse generating coil 1, which circuit 3 consists of two diodes, a PIN diode D1 and a silicon diode D2 which are connected in antiparallel with each other.

A bias current feedline 4 connects a generator of said bias current (not shown in detail) to a pair of diodes D1, D2 and particularly to the PIN diode D1. In order to avoid any mutual interference between the excitation pulse and the bias pulse, a RF trap 5 (only schematically indicated as 5, as it is generally known and widely used in prior art active decoupling circuits; see for instance prior art and device description in U.S. Pat. No. 4,763,076).

The diagram also includes a circuit (not expressly shown) for synchronizing the generator of the transmit coil exciting pulses with the generator of the bias current, in such a manner as to cause the decoupling circuit 3 to switch to the conductive state at the start of the excitation pulse transmission to the transmit coil 1 and to switch to the nonconductive state at the end of transmit coil exciting pulse transmission.

Figure 2:
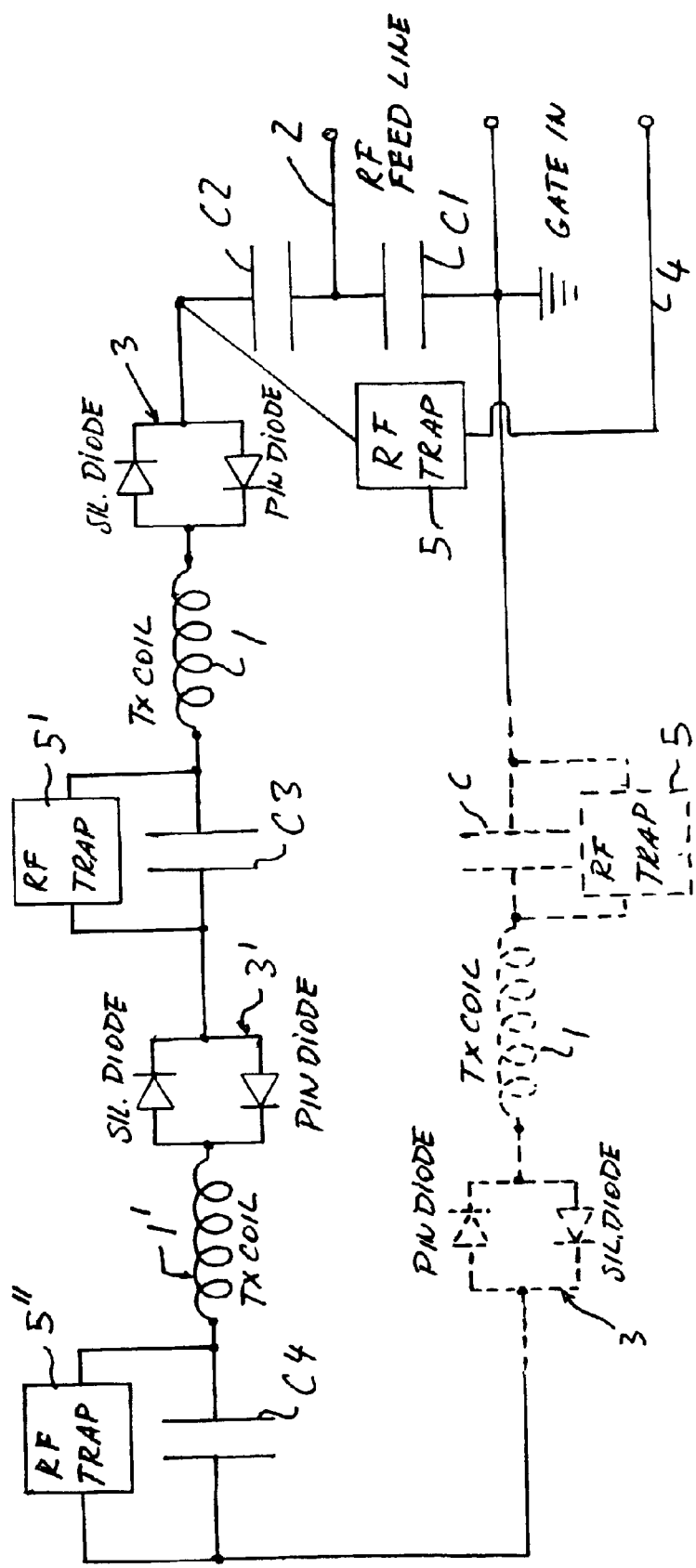
FIG. 2 shows a second embodiment in which the decoupling circuit has a transmit coil divided into different electrically separated coil sections, each being associated with a pair of diodes, a PIN diode and a silicon diode, connected in antiparallel to each other.

FIG. 2 shows an embodiment which is closer to the actual construction of a transmit coil for Nuclear Magnetic Resonance imaging apparatuses. In this embodiment, the transmit coil consists of a conductor divided into individual sections, each of which corresponds to one or more turns indicated as 1 and 1', and are connected in series with each other. A decoupling circuit 3, 3' is connected in series after each transmit coil section 1, 1', and is dedicated to the downstream section 1, 1'. Upstream from each transmit coil section 1, 1', there are provided a tuning capacitor C1, C2, C3, C4 and a RF trap 5', the latter being connected in parallel with said tuning capacitor, like in the condition as shown in the simplified example of FIG. 1.

In practice, the example of FIG. 2 is electrically equivalent to the one of FIG. 1, except that it is adapted to the presence of several sections of the transmit coil 1.

An additional trap 5" should be provided in combination with the tuning capacitor C4 downstream from the sections 1, 1' of the transmit coil.

Although FIG. 2 only shows two sections, the skilled person may easily use it to derive the scheme for circuits having transmit coils divided into three or more sections, by connecting in series additional sections of the transmit coil with a pair 3 of diodes D1 and D2, in antiparallel with each other, a tuning capacitor and a RF trap being provided upstream therefrom.

Figure 4:
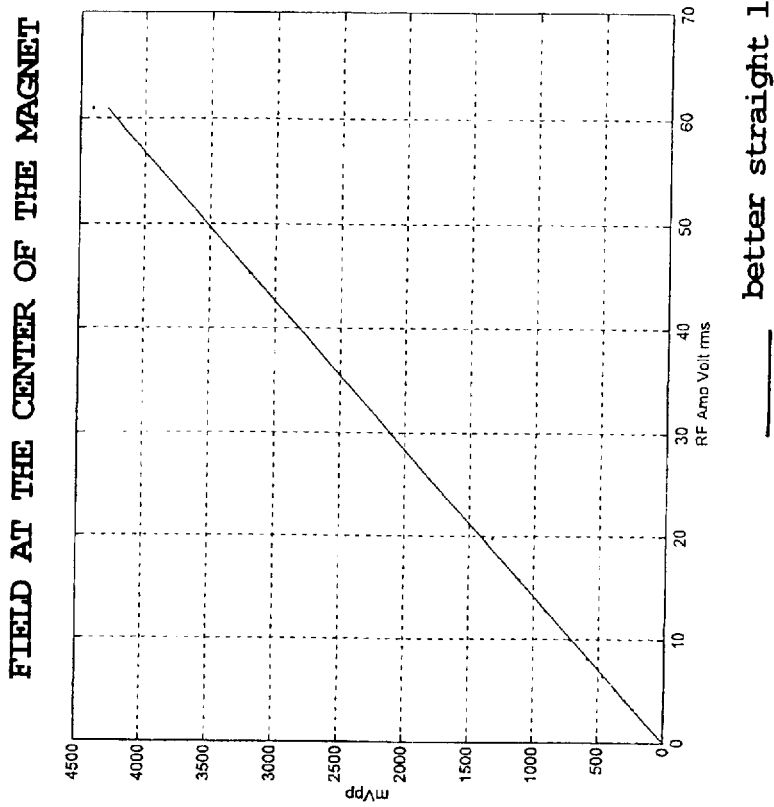
FIGS. 3 and 4 show two diagrams comparing the effects of the traditional passive decoupling circuit (dotted line) with an ideal straight line (continuous line) of the magnetic field as measured at the center of the transmit coil, as a function of the excitation pulse power determined as an amplitude value in Volts.
Figure 3:
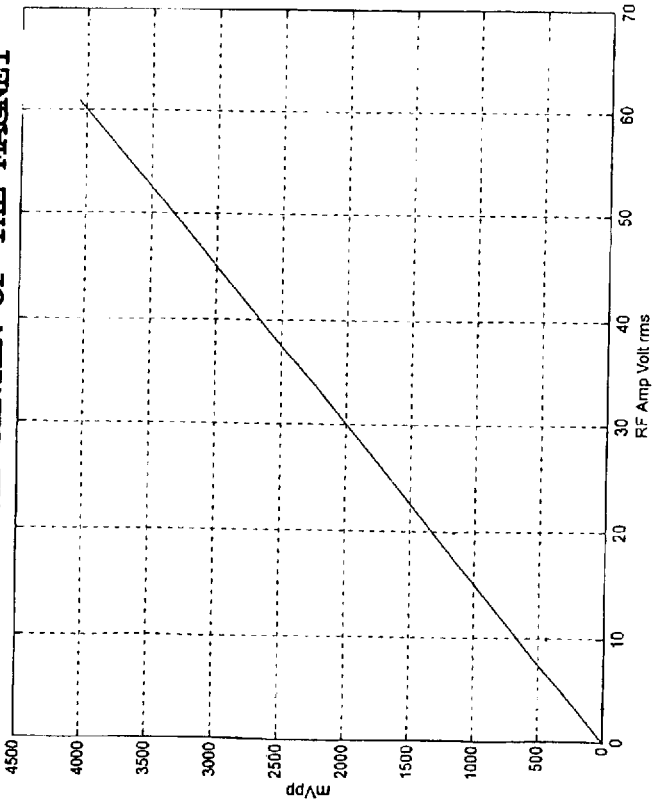

FIGS. 3 and 4 include two adjacent diagrams showing the field value at the center of the transmit coil as a function of the excitation pulse amplitude, in Volts.

In FIG. 3, the decoupling circuit is a passive decoupling circuit, i.e., the conductive and nonconductive state of the decoupling circuit is determined by the RF excitation signal, whereas in FIG. 4, the decoupling circuit is arranged according to an embodiment of this invention.

Both figures show the ideal field curve at the center of the transmit coil as a function of the excitation pulse amplitude, in Volts.

The two figures clearly show the clipping effect of the passive decoupling circuit for low signal amplitudes, i.e., for small excitation signals. As the excitation pulse amplitude decreases, the magnetic field intensity, as measured and indicated by the dotted line, also decreases as compared with the ideal intensity. For very low excitation pulse amplitude values, the field inside the transmit coil is null, due to the clipping effect caused by the characteristics of the diode. As the excitation pulse amplitude increases, the field generated by the transmit coil becomes closer to the ideal field, as indicated by the ideal straight line.

With an active decoupling circuit according to an embodiment of the invention, the actually measured magnetic field essentially coincides with the ideal field as indicated by the straight line, even for very low power, i.e., amplitude values of excitation pulses. At high power or amplitude values, the magnetic field measured in the transmit coil always substantially corresponds to the ideal field as indicated by the straight line or diverges therefrom within acceptable tolerance limits.

When one PIN diode only is provided as a decoupling element, at high excitation pulse power values and for the negative half-period thereof, a reduction of the magnetic field intensity should actually occur, due to the progressive consumption of the bias charge by the negative current in the negative half-period. This difference should increase with longer excitation pulse periods, and the compensation for this effect would require an increase of the bias current to such levels as to cause the destruction of the PIN diode when it is intended not to switch to the nonconductive condition, due to the reduction of the bias charge during the negative half-period of the excitation pulse.

Figure 5:
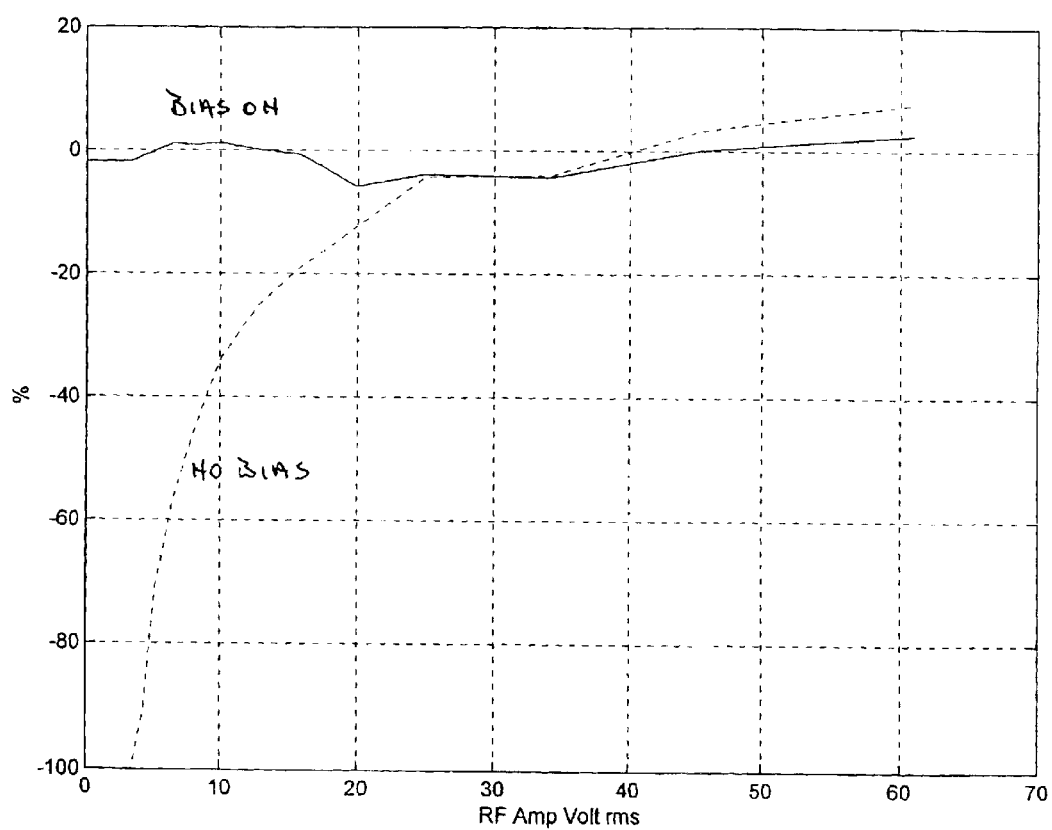
FIG. 5 shows the curve of the divergences between the ideal magnetic field of the transmit coil (continuous line) and the actual magnetic field (dotted line) obtained with a decoupling circuit according to the invention, as a function of the excitation pulse power determined as an amplitude value in Volts.

FIG. 5 shows in a single diagram the distortion, i.e., the magnetic field difference in the excitation coil as a function of the excitation pulse amplitude in comparison with the ideal pulse amplitude for a passive decoupling circuit (dash line) and for a decoupling circuit of the invention (continuous line).

The ideal straight line would result in a horizontal line passing through zero.

The inventive decoupling circuit appears to introduce smaller distortions as compared with the ideal curve of the field, which distortions are in the range of acceptable tolerances, both at high and at very low amplitudes, thereby obviating both the drawbacks of passive circuits at low amplitude or power values of excitation pulses and the drawbacks of traditional active circuits at high power or amplitude values of excitation pulses.

The dash line clearly shows the clipping effect caused by passive decoupling circuits at low power or amplitude values of the excitation signal.

The traditional active circuit is not shown, but its behavior might be inferred as a function of the above, which means that, by progressively increasing the resistance of the PIN diode as the bias charge decreases, particularly for relatively long excitation pulse periods, the distortion would increase at high power values, due to a loss of magnetic field intensity. When the excitation current increases, in order to maintain the full conductive state, the diode would be destroyed, resulting either in a full conductive state and no decoupling at the end of the excitation pulse or in circuit breaking.

Obviously, the invention is not limited to what has been described and illustrated herein, but may be widely varied, especially as regards construction, without departure from the guiding principle disclosed above and claimed below.

What is claimed is:

1. A circuit for active decoupling of transmit coils in Nuclear Magnetic Resonance imaging apparatuses, the circuit comprising:

at least one PIN diode which is connected in series with conductors of at least one transmit coil and which PIN diode has at least one input for an incoming bias current;

means for generating and feeding the incoming bias current to the PIN diode to switch the PIN diode to a conductive state at the start of an excitation pulse transmission, and to control a nonconductive state of the PIN diode and a decoupling of the transmit coil from the receiving coil at an end of the excitation pulse transmission in an absence of the bias current; and said circuit further having a silicon diode connected in antiparallel with the PIN diode.

2. The circuit as claimed in claim 1, wherein the circuit includes several PIN diodes connected in series to each other, each having an input for a bias current, which input is connected to a generator of said bias current, a silicon diode being provided for each of said PIN diodes and being connected thereto in antiparallel.

3. The circuit as claimed in claim 1, wherein the circuit has at least two pairs of diodes connected in antiparallel with each other and in series with the conductors of the transmit coil, one of the two diodes being a PIN diode and the other a silicon diode, said pairs of diodes being connected in series with each other and with the conductors of the transmit coil.

4. The circuit as claimed in claim 1, wherein the circuit has at least two pairs of diodes connected in antiparallel with each other and in series with the conductors of the transmit coil, one of the two diodes being a PIN diode and the other a silicon diode, said pairs of diodes being connected in series with each other or with the conductors of the transmit coil.

5. The circuit as claimed in claim 1, wherein the Nuclear Magnetic Resonance imaging apparatus is of a low field type.

6. A circuit for a Nuclear Magnetic Resonance imaging apparatus, the circuit comprising:
    a transmit coil having a plurality of sections;
    a plurality of pairs of diodes, each pair including a PIN diode and a silicon diode connected in antiparallel with the PIN diode;
    each pair of diodes is connected in series with and upstream of a respective one of the sections of the transmit coil;
    each of the PIN diodes has at least one input for an incoming bias current; and
    means for generating and feeding the incoming bias currents to the PIN diodes to switch the PIN diodes to a conductive state at the start of an excitation pulse transmission, and to control a nonconductive state of the PIN diode and a decoupling of the transmit coil from the receiving coil at an end of the excitation pulse transmission in an absence of the bias current.

7. The circuit as claimed in claim 6, wherein the Nuclear Magnetic Resonance imaging apparatus is of a low field type.

8. The circuit as claimed in claim 6, wherein ones of the pairs of diodes are connected in series between the transmit coil sections.

9. A circuit for active decoupling of transmit coils in a Nuclear Magnetic Resonance imaging apparatus, the circuit comprising:
    at least one PIN diode which is connected in series with conductors of at least one transmit coil and which PIN diode has at least one input for an incoming bias current;
    a bias current generator arranged to supply the incoming bias current to the PIN diode to switch the PIN diode to a conductive state at the start of an excitation pulse transmission, and to control a nonconductive state of the PIN diode and a decoupling of the transmit coil from the receiving coil at an end of the excitation pulse transmission in an absence of the bias current; and
    a silicon diode connected in antiparallel with the PIN diode.

10. The circuit as claimed in claim 9, wherein the circuit includes several PIN diodes connected in series to each other, each having an input for a bias current, which input is connected to the bias current generator, a silicon diode being provided for each of said PIN diodes and being connected thereto in antiparallel.

11. The circuit as claimed in claim 9, comprising:
    at least two pairs of diodes connected in antiparallel with each other and in series with the conductors of the transmit coil, one of the two diodes being a PIN diode and the other a silicon diode, said pairs of diodes being connected in series with each other and with the conductors of the transmit coil.

12. The circuit as claimed in claim 9, wherein the circuit has at least two pairs of diodes connected in antiparallel with each other and in series with the conductors of the transmit coil, one of the two diodes being a PIN diode and the other a silicon diode, said pairs of diodes being connected in series with each other or with the conductors of the transmit coil.

13. The circuit as claimed in claim 9, wherein the Nuclear Magnetic Resonance imaging apparatus is of a low field type.

14. The circuit as claimed in claim 9, comprising:
    a synchronizing circuit arranged to synchronize the bias current generator with the excitation pulse transmission.

15. A circuit for a Nuclear Magnetic Resonance imaging apparatus, the circuit comprising:
    a transmit coil having a plurality of sections;
    a plurality of pairs of diodes, each pair including a PIN diode and a silicon diode connected in antiparallel with the PIN diode;
    each pair of diodes is connected in series with and upstream of a respective one of the sections of the transmit coil;
    each of the PIN diodes has at least one input for an incoming bias current; and
    a bias current generator arranged to supply incoming bias currents to the PIN diodes to switch the PIN diodes to a conductive state at the start of an excitation pulse transmission, and to control a nonconductive state of the PIN diode and a decoupling of the transmit coil from the receiving coil at an end of the excitation pulse transmission in an absence of the bias current.

16. The circuit as claimed in claim 15, wherein the Nuclear Magnetic Resonance imaging apparatus is of a low field type.

17. The circuit as claimed in claim 15, wherein ones of the pairs of diodes are connected in series between the transmit coil sections.

18. The circuit as claimed in claim 15, comprising a synchronizing circuit arranged to synchronize the bias current generator with the excitation pulse transmission.

* * * * *